United States Patent
Wortberg (10) Patent No.: US 10,345,351 B2
(45) Date of Patent: Jul. 9, 2019

(54) METHOD AND CONTROL DEVICE FOR MONITORING AN ON-BOARD ELECTRICAL SYSTEM OF A VEHICLE

(71) Applicant: Lisa Draexlmaier GmbH, Vilsbiburg (DE)

(72) Inventor: Michael Wortberg, Dorfen (DE)

(73) Assignee: Lisa Draexlmaier GmbH, Vilsbiburg (DE)

( * ) Notice: Subject to any disclaimer, the term of this patent is extended or adjusted under 35 U.S.C. 154(b) by 0 days.

(21) Appl. No.: 15/480,308

(22) Filed: Apr. 5, 2017

(65) Prior Publication Data

US 2017/0292983 A1  Oct. 12, 2017

(30) Foreign Application Priority Data

Apr. 6, 2016 (DE) .......................... 10 2016 106 296

(51) Int. Cl.
G01R 31/00 (2006.01)
G01R 31/02 (2006.01)
G01R 31/36 (2019.01)

(52) U.S. Cl.
CPC .................................. G01R 31/007 (2013.01)

(58) Field of Classification Search
CPC .................................................... G01R 31/007
See application file for complete search history.

(56) References Cited

U.S. PATENT DOCUMENTS

2009/0226769 A1* 9/2009 Ota ................... H01M 8/04029
429/458
2010/0211249 A1* 8/2010 McClellan ............. G07C 5/006
701/31.4

(Continued)

FOREIGN PATENT DOCUMENTS

CN          204086909 U  *  1/2015
DE   10 2006 043 419 A1     3/2008

(Continued)

OTHER PUBLICATIONS

German Office Action dated Jan. 30, 2017, 14 pages.

*Primary Examiner* — Huy Q Phan
*Assistant Examiner* — Zannatul Ferdous
(74) *Attorney, Agent, or Firm* — Finnegan, Henderson, Farabow, Garrett & Dunner, LLP (57) ABSTRACT

The present disclosure relates to a method for monitoring an on-board electrical system of a vehicle having at least one distributor and a load that are connected together via a cable. In one implementation, the method includes reading in a sequence of data for a number of parameters representing information about operation of the vehicle by a driver and/or about a state of the vehicle and/or a state of the driver and/or a driving environment; classifying the data as a normal value or an error value; and evaluating the data classified as an error value or a normal value. The normal values may lie within a state space separated from the error values by a discrimination limit. Evaluating the data classified as an error value may include determining if the data classified as an error value fulfils a criterion, and evaluating the data classified as a normal value may include statistically evaluating to determine a stochastic parameter and determining if the stochastic parameter exceeds a threshold value.

19 Claims, 8 Drawing Sheets

(56) References Cited

U.S. PATENT DOCUMENTS

| | | | |
|---|---|---|---|
| 2010/0261084 A1* | 10/2010 | Yoshida | H01M 8/04186 429/432 |
| 2012/0091971 A1* | 4/2012 | Syed | B60L 11/1851 320/162 |
| 2012/0141895 A1* | 6/2012 | Kwon | H01M 8/04037 429/429 |
| 2015/0025703 A1* | 1/2015 | Vander Laan | G05F 1/66 700/297 |
| 2017/0242079 A1* | 8/2017 | Duan | B60L 11/1861 |

FOREIGN PATENT DOCUMENTS

| | | |
|---|---|---|
| DE | 10 2014 004 791 B3 | 6/2015 |
| DE | 10 2014 018 640 B3 | 3/2016 |

* cited by examiner

METHOD AND CONTROL DEVICE FOR MONITORING AN ON-BOARD ELECTRICAL SYSTEM OF A VEHICLE

This application claims the benefit of priority of German Patent Application No. 102016106296.0, filed on Apr. 6, 2016, which is incorporated herein by reference.

TECHNICAL FIELD

The present invention relates to a method and to a control device for monitoring an on-board electrical system of a vehicle.

BACKGROUND

The on-board electrical system of a vehicle connects a power source via distributors and sub-distributors to the various loads or consumers. Thus, the components of the on-board electrical systems may be understood to include distributors, sub-distributors and loads, as well as cables connecting these elements together. The cables in such cases are connected via plug connections to interfaces of the distributors, sub-distributors or loads. The plug connections represent inputs and outputs of the given components. Aside from a total failure of a cable, degradation processes may befall the cables and plug connections in the course of the lifetime of a vehicle. These processes cause a gradual deterioration of the affected components of the on-board electrical system and ultimately bring about the failure of the component.

The electrification of growing numbers of functions has been accompanied by steadily increasing numbers of consumers in the system. The task of safeguarding the on-board electrical system as an energetically and informationally linked system is becoming increasingly complex as possible interactions of the components become more and more difficult to recognize. At the same time, a comprehensive diagnostic program should be implemented in the on-board system in order to meet requirements concerning functional safety.

Safety-relevant functions such as automated steering during parallel parking already exist in today's vehicles. These functions must be fail-safe, meaning that when an error is detected the safe state "off" is adopted and the driver is informed via display instruments. Observing the functional safety of these functions therefore often ends at the plug of the control device, since an interruption or outage of the power supply leads directly to the safe state "off". Thus, there is no need for a safety function at the power supply level.

Automated driving systems on the other hand must be configured fail operational with an error state transition to the safe state "on". The power supply outage (supply line) or communication (bus line) outage for this function may result in a direct endangerment of human beings. The safe "on" state must be maintained until the vehicle can be halted at a safe location or until the driver can take over control of the vehicle.

DE 10 2015 209 588 B3 discloses a simple and reliable device for recognizing malfunctions in an on-board electrical system. The device includes a receiving unit configured to receive a first and a second sequence of measured values, with the measured values of the first sequence being measured at a first measuring point of the on-board electrical system and with the measured values of the second sequence being measured at a second measuring point of the on-board electrical system that differs from the first measuring point. The measured values represent current or voltage values. The device also includes an evaluation unit configured to recognize the occurrence of a malfunction on the basis of a comparison of a first dispersion of the measured values of the first sequence and a second dispersion of the measured values of the second sequence.

DE 10 2014 018 640 B3 discloses a method for detecting electrical resistance in a motor vehicle. In a first measuring phase, in which a first device receives a load current from a voltage source and all other devices receive a quiescent current from the voltage source, the first device detects a first voltage value and a load current value and a second device detects a second voltage value. In a second measuring phase in which each of the devices receives a particular quiescent current from the voltage source, the second device detects a third voltage value and the first device a fourth voltage value. An evaluating unit ascertains a connection resistance of a connecting cable of the first device on the basis of the first voltage value, the second voltage value, the third voltage value, the fourth voltage value and the load current value.

DE 10 2014 004 791 B3 describes a method of checking a connection between a battery that supplies a low-voltage network of a motor vehicle and the low-voltage network. In this method, a DC voltage converter connects a high-voltage network to the low-voltage network, and the output voltage is modulated by the DC voltage converter into the low-voltage network at a modulation frequency. The current thereby injected and the voltage thereby injected are measured by the battery and a resistance value is determined and evaluated with regard to at least one connection criterion. A disruption of the connection is then ascertained if there is at least one unfulfilled connection criterion.

DESCRIPTION

It is the object of the present invention to use a diagnostic procedure to recognize imminent malfunctions (degradation processes) easily and reliably at an early stage.

The object is achieved by the subject matters of the independent claims. Advantageous further developments of the invention are specified in the dependent claims, the description and the accompanying drawings.

The method of the invention for monitoring an on-board electrical system of a vehicle includes a reading-in step, a classifying step and an evaluating step. The on-board electrical system includes at least one distributor and a load connected by a cable. The distributor is connected to a current source or to another distributor. A sequence of data is read in during the reading-in step. The data includes at least one parameter or a plurality of parameters. Each parameter here represents information about operation of the vehicle by a driver and additionally or alternatively about a state of the vehicle, a state of the driver or a driving environment of the vehicle. Thus, a parameter may represent measurement data or parameters derived from the measurement data, but it may also represent information from another source such as a navigation device or position data such as GPS data, environmental data such as temperature, air humidity, road conditions, precipitation, etc. In the classifying step the read-in data is classified as a normal value or an error value. For this purpose a state space is used that defines a discriminating limit between a valid range of normal values and the other ranges of values. The state space has a dimension corresponding to the number of parameters. If a number n of parameters Pn is monitored and thus read in, then the state space has the dimension n corresponding to the number n of the linked parameters. As an option, a plurality of parameters may be combined to form a value derived from them, and this derived value is represented as a parameter in the state space. The derived value, however, may also be determined before being read in and the derived value may be read in as a parameter. The normal values lie within the range of values defined by the discriminating limit or within the state space. The discriminating limit may also be multi-dimensional, corresponding to the dimension of the state space. The data classified as error values and the data classified additionally or alternatively as normal values are evaluated in the evaluating step. Error information is found here if the data classified as an error value meets a criterion. A criterion in this case may be a rule that can be described mathematically. For instance, the criterion can be defined algebraically or statistically. Alternatively or additionally the data classified as a normal value is evaluated stochastically to determine a stochastic parameter. A stochastic parameter may be understood to be a mean value (algebraic, geometric, . . . ), a standard deviation, a variance, a mode, a distribution, a correlation coefficient or the like. Error information here is recognized as an error if the stochastic parameter exceeds a threshold value. For example, the threshold value may be a fixed quantity or a deviation by percent. Thus, a slow drift of the data classified as a normal value can be recognized and degradation ascertained.

The read-in data can be considered a cloud of points or a cluster, with the cloud of points generally not significantly changing its basic position. A migration or drifting of the cloud of points can be diagnosed as an error or an emerging error, even if no value of a parameter has yet been classified as an error value. With this procedure imminent errors caused by a degradation of a contact, for example, can be recognized early and eliminated as part of a predictive maintenance, thereby enhancing the safety of the entire system that constitutes the vehicle.

The method is advantageous for monitoring the quality of a connection between components of the on-board electrical system. In the reading-in step a resistance value of the cable can be read in at intervals during operation of the vehicle and a quantity of parameters may also be read in additionally or alternatively and the resistance value determined from them. A drive motor of the vehicle is switched off at least once in the course of the reading in. This allows the method to be used to diagnose a gradual malfunction during operation of the vehicle. The diagnostic possibilities thus advantageously reach beyond measurements and analyses performed at a testing station. Therefore, data may be gathered, read in and stored over long periods of time, e.g., days, weeks, months or even years. This ensures that evaluations referring to errors or future or potential errors will be possible throughout this (long) period of time.

Components of the on-board electrical system may be connected to at least one distributor and one load that are interconnected via a cable. During the reading-in step, in a sub-step of definition, a resistance value of the cable may be determined at multiple time intervals. The resistance value here is measured while the on-board electrical system is activated, meaning during operation of the vehicle. A drive motor of the vehicle is switched off at least once between the determining actions. In the classifying step, in a sub-step of ascertaining, error information can be obtained using the resistance value and predetermined comparative information.

As described above, for certain applications such as autonomous driving, the functional safety of the loads must be ensured for parts of the on-board electrical system. Even when corresponding parts are to be embodied as redundant parts, the functionality must be guaranteed. To achieve this, the quality of the connection between components is monitored. Since degradation processes are observed, the resistance value is determined over a longer period of time. A degradation process of this type can initially develop gradually over a period of months. For instance the observation period selected covers several trips or driving cycles. A driving cycle in this case is delimited by switching off the drive motor at least once and stopping the vehicle. Thus, a driving cycle may be defined as a time interval in which the vehicle is continuously in operation, for instance with the drive motor switched on. Brief interruptions caused by a start-stop automation may be ignored here, meaning that the driving cycle then lasts through such interruptions. A driving cycle may be delimited by an interruption in operation of the vehicle. Thus, the resistance value of the cable is determined in at least two different driving cycles. In that case the resistance value represents a value corresponding to the resistance of the cable.

An expected value with a surrounding tolerance range or ranges exists for the resistance of the cable. A tolerance range can therefore be defined for different degrees of error or degradation of the connection. The tolerance range or ranges defined in this manner may then serve as a basis for the comparative information, thereby permitting the error information to be defined when considered together with the determined resistance value. Thus, for example, in one embodiment of the invention a doubling of the resistance of the cable may be defined as a malfunction.

Furthermore, in the reading-in step a voltage value that represents a voltage drop through the cable can be read in. The resistance value here can be determined using the voltage value in a sub-step of determining. In an advantageous embodiment, through the stochastic dispersion, the selection of the time interval between two read-in voltage values or the selection of the moment at which the voltage values are read in, the influence of a variable load can be eliminated or at least kept low enough that it has no significant influence on the resistance value to be determined. If the influence of the load is disregarded, then the current may be considered as being constant. In this case the voltage drop correlates with the resistance value. In the on-board electrical system it may be assumed that the load remains within a defined load range, meaning that a certain bandwidth may be assumed as the expected range for the current. It follows that the voltage drop through the cable is expected to lie within a corresponding voltage range.

It is also favorable to read in a current value in the reading-in step that represents a current between the output of the distributor and the load. The resistance value can be advantageously determined using the current value. As already explained above, the load and a load profile yield an expected bandwidth for the electric current value. A deviation, i.e. a current value outside of the comparative range, would suggest that the resistance value has changed. In a favorable variant of the method introduced here, the resistance value can be directly determined with the aid of Ohm's law.

After the reading-in step, in one embodiment a mean value of voltage values read in during a predefined mean-value time period can be formed and the mean value can be used as the voltage value in the subsequent steps. The advantage of this is that a possible influence of a variable or changing load on the voltage drop through the cable is still negligible. The resistance values can be gathered at a high scan rate. A high scan rate in this context means a scan rate of between 100 and 1000 Hz. A favorable embodiment of the invention describes determining a resistance value of the cable with a time gap of several milliseconds, particularly forming a mean value of several seconds, i.e. at least three seconds, preferably more than seven seconds. Determining the mean value results in an aggregation of data. The advantage of a scanning rate in the single-digit millisecond range is that peaks in the voltage curve are detected, but due to the formation of a mean value, they do not heavily influence the result. A similar positive effect is achieved by long measuring intervals, whereby the impact of corresponding outliers on the result is likewise reduced. Selecting the length of the mean value interval can affect the possible error in defining the resistance value. A longer mean value interval is preferable to a shorter one. This is how the values to be provided can be reduced and the influence of load peaks can be lessened. In a preferred embodiment the mean value interval corresponds to the duration of a driving cycle.

It is also advantageous if a step of identifying stochastic variables follows the step of forming the mean value over a mean value interval. In the step of identifying stochastic variables a dispersion of the mean values over a plurality of driving cycles can be identified. For example, the dispersion over 10 to 50 driving cycles, preferably 15 to 30 and more preferably 20 to 25 driving cycles can be identified. A continuous dispersion gliding over the selected number of driving cycles can be detected. In a particular embodiment the dispersion can be detected over all stored driving cycles, i.e. over all stored values of all driving cycles. However, as this is complicated, it will be of advantage to limit the number of driving cycles as described here.

Aside from the dispersion, in the step of identifying stochastic variables a standard deviation or a correlation coefficient can also be ascertained. This constitutes an advantageous indication of a stochastic change in the resistance value or in the transition resistance it represents in the cable being monitored. For instance, the error information can be generated using the identified stochastic variables, for example by defining a limit value for the dispersion or the correlation coefficient as comparative information.

To detect the voltage drop through the cable, an output voltage value is read in that represents an output voltage at the output of the distributor, and an input voltage value is read in that represents an input voltage at the input of a sub-distributor or the load, connected to the output via the cable. Many components of the on-board electrical system already detect input or output voltages. Thus, the voltage drop through the cable can be advantageously determined without additional measuring efforts. Thus it is possible to implement additional monitoring of the functional safety at a low cost.

A storing step is advantageously used to save the values relating to resistance, voltage, current, output voltage, input voltage, one or more stochastic parameters and/or the mean values. Thus, the evaluation does not merely recognize an error when it occurs. Instead, with corresponding data analysis it is possible to discover trends at an early point in time. Thus, it becomes advantageously possible to confront errors with predictive maintenance, without having to make costly, pointless component replacements.

Saving the values to be stored only if they represent a new minimum or maximum can reduce data in the storing step. Thus, the memory to be maintained in the vehicle can be kept smaller. The data volume to be transferred is also reduced if the values to be stored are transmitted to a cloud in the sense of vehicle-to-infrastructure (car-to-X or C2X), where they are stored and evaluated.

Furthermore, at least one additional item of vehicle information can be stored in the storing step. Some examples of additional vehicle information of this sort include motor information, decor information about the vehicle, geographical location of the vehicle in operation, climatic conditions such as temperature or humidity, road conditions or a specific time for storing the saved values. Then, in the evaluating step, the error information can be determined using the more or one additional items of information.

In a preferred embodiment, the method may also include an additional step of transferring the values stored in the storage step to a central infrastructure unit. An infrastructure unit in this case may be understood to be a cloud. The values to be stored can be transmitted, transferred or received at least partly on a wireless basis. In this way, the corresponding data from a plurality of vehicles can be collected and evaluated in the central infrastructure unit. The large quantities of data that accumulate accordingly make it possible to recognize, errors, or rather trends for future errors, at an even earlier point in time. They can then be remedied in the course of the regular maintenance of the individual vehicles.

If evaluation is conducted in the cloud, the advantageous result may be the creation of a system with learning capabilities. For instance, observing how read-in data drifts in the form of a cloud of points or a cluster across a large number of vehicles can reveal the existence of a missing parameter, for instance environmental influences such as ambient temperature. Data in the cloud may also be further augmented through a connection with other data or information sources for evaluation purposes.

It is advantageous if at least individual steps of the method introduced here are carried out repeatedly. Thus it is possible to repeatedly perform the steps of reading in, forming, classifying, determining, evaluating or identifying, making available, storing and/or transferring. For instance in the evaluating step the error information can be determined using the stored values. As already indicated above, a larger quantity of data enables earlier recognition of an error trend.

If an infrastructure unit is used, at least a portion of the method can be carried out there or using the values stored in the infrastructure unit. In this embodiment the method may include the following additional steps: receiving a plurality of values from a plurality of vehicles in an infrastructure unit;- depositing the plurality of values in a central memory device of the infrastructure unit; determining at least one item of error information for at least one on-board electrical system of one of the vehicles, using the plurality of values of the plurality of vehicles; and making the error information from the infrastructure unit available to at least one of the vehicles and/or to a monitoring function for the plurality of vehicles.

The method may include a step of defining the comparative information using the sequence of data for a number of parameters, the stochastic parameters, the voltage values, the output voltage values and the input voltage values, the mean values and/or the current values. Thus, the comparative information can be adapted to the corresponding influences.

A focal point of the data is advantageously determined as a stochastic parameter in the evaluating step. Error information that represents degradation or a predicted error is recognized if the focal point shifts over time. A movement of the focal point is detected here and compared to a threshold value or a derivation of the movement of the focal point is determined and compared to a threshold value. If the threshold value is exceeded, error information is made available.

In addition, in the evaluation step a quantity of data classified as error values can be monitored as a criterion in a predetermined time period. The criterion for the output of error information can be defined as reaching a predefined quantity of data that is classified as error values. Here it can be specified that the predefined quantity of data classified as error values is reached in a gliding time interval. As an alternative, a distance from the discriminating limit may be defined as the error information. Thus, the predefined quantity may vary depending on the distance from the discriminating limit.

In an optional step of learning, a number of state spaces can be trained. In a first reading-in sub-step a sequence of learning data is read in for a number of parameters. These parameters were categorized beforehand as representing normal values. In a second sub-step, at least one envelope is defined as the discriminating limit for the trained state spaces. The sequence of learning data read in during the sub-step of reading in as part of the learning step may be the result of a simulation and additionally or alternatively they may be measured data from different driving trials such as summer or winter tests. The learning data includes at least one parameter or a plurality of parameters. These are the same parameters that were read in in productive use during the step of reading in.

The one or more sequences of data are derived as an option in a derivation step between the reading-in step and the classifying step. Then the derived data is classified in the classifying step and the classified, evaluated data is analyzed in the evaluation step.

The object given above is also carried out by means of a control device for monitoring an on-board electrical system of at least one vehicle. Here the components of the on-board electrical system include at least one distributor and a load connected via a cable. The control device comprises at least one unit for reading in a sequence of data for a number of parameters that represent information about operation of the vehicle by a driver and/or a state of the vehicle and/or a state of the driver and/or a driving environment. The control device also comprises a device for classifying the data as a normal value or an error value, wherein the normal values per parameter lie within a state space that is separated from the error values by a discriminating limit. The control device further comprises a unit for evaluating the data classified as an error value and/or a unit for evaluating the data classified as the normal value, wherein an error is recognized if the data classified as an error value fulfills a criterion, and wherein the data classified as the normal value is statistically evaluated to determine a statistical parameter, and an error is recognized if the statistical parameter exceeds a threshold value.

The control device mentioned here may be a processor unit and/or an at least partly permanently wired or logical switching arrangement for the described method. This control device can be or include any type of processor or calculator or computer with the corresponding necessary periphery (memory, input/output interfaces, input-output-devices, etc.).

The above-given explanations referring to the method also apply analogously to the control device and vice versa. The control device may be embodied as one component or divided up into several components.

The solution introduced here also includes a software product that can be loaded directly into a memory of a digital computer and comprises program code parts suitable for carrying out steps of the method described here.

The above-described properties, features and advantages of the present invention, as well as the manner in which they are achieved, will become clearer and more easily understood within the context of the following schematic description of embodiments explained below in greater detail with reference to the drawings. For easier understanding the same or similar elements are provided with the same reference numbers.

BRIEF DESCRIPTION OF THE DRAWINGS

An advantageous embodiment of the invention is explained below with reference to the accompanying drawings. The drawings show.

The drawings are merely schematic representations and serve only to explain the invention. The same or similar elements are provided throughout with the same reference numbers.

DETAILED DESCRIPTION

Modern vehicle functions must be considered from the perspective of functional safety. Autonomous driving systems are functions relevant to functional safety.

Diagnosis is an integral component of a safety concept that meets the requirements of ISO 26262. Implementing redundant power cables without diagnosis does not represent an adequate safety concept, since the cable on reserve as redundant cannot be available to take over supplying power in the event of a failure caused by a latent defect. The diagnosis as an integral component of the safety concept results initially in higher cost and effort. On the other hand, a single diagnosed supply path without redundancies may possibly be adequate for a convincing safety concept. This would be the case if it is possible to recognize developing failures on time (supply outage through degradation processes). Minimizing redundant cables in the cable set is highly desirable since today's cable sets are already approaching their limits with regard to weight and installation space.

Degradation processes (e.g., degradation of a contact) are based on error growth processes. Failure models are worked out on the basis of the description of these processes.

Error growth processes are self-reinforcing and can fundamentally be abstracted by exponential functions.

Thus, the following equation may be given for the growth of an error (a malfunction) S:

$$S = S0 * \exp[c(t)t]$$

where S0: initial state
c(t): growth constant This is not constant, since the drivers of the failure variable change depending on the state.

This can be explained on the basis of an example of a self-reinforcing growth of a malfunction by friction corrosion (fretting corrosion) in a contact. The friction corrosion itself has a small growth constant C1, with the result that the malfunction builds up over a long time (such as several months). The malfunction results in a change in the characteristic value of transition resistance. The increased transition resistance in turn results in an increase in power loss in the contact. If this additional power loss can no longer be adequately dissipated, then the damaging process of thermo-mechanical destruction begins. This has a considerably larger growth constant C2. The heat released leads to an increase in the transition resistance, which in turn leads to a self-reinforcing additional heating (thermal runaway). This process leads to sudden failure of the contact when the point is reached, and supply to the safety-relevant function is interrupted.

The method described below is a special embodiment in which a change in the characteristic parameter of transition resistance is monitored before the critical failure point in time is reached.

Figure 1:
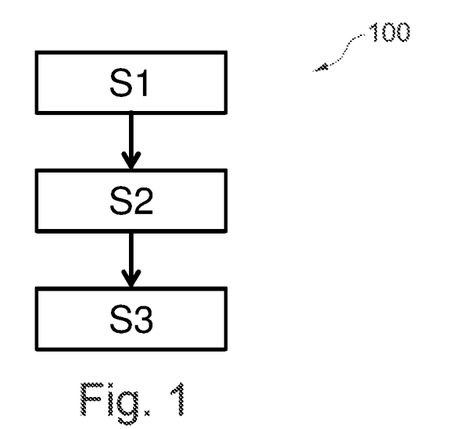
FIG. 1: a flowchart of the method of the invention.

FIG. 1 shows a flowchart of a method 100 for monitoring an on-board electrical system of a vehicle in accordance with an embodiment of the present invention. The method 100 in its most general form includes at least three steps: reading S1, classifying S2, evaluating S3.

In step S1, the reading-in step, a sequence of data is read in for a number n of parameters Pn. The letter n represents a natural number greater than or equal to 1. The parameters represent information about operation of the vehicle by a driver, about a state of the vehicle, a state of the driver or a state of a driving environment. In this way, measured data in combination with information from databases or navigation systems or weather information can be read in and processed in the subsequent steps. In the next step S2, the classifying step, the values that have been read in are differentiated as normal and error values. For this purpose, individual parameters are examined with regard to a position in an associated state space or the number of parameters is examined with regard to an n-dimensional state space, to enable the data to be differentiated and assigned accordingly to normal values and error values. The normal values are separated from the error values by a discrimination limit. In step S3 the classified data is evaluated. In a first variant, the data classified here as an error value is evaluated. Thus, an error is indicated when a predetermined quantity of data classified as an error value has been classified in a predefined (gliding) time interval. In another variant all data or the data classified as normal values is combined to form a cluster, i.e. a sort of cloud of points, and is considered as such. The data in this variant is evaluated stochastically in order to determine a stochastic parameter such as a focal point (geometric or algebraic center), standard deviation, variance, median, etc. Error information is made available if the stochastic parameter exceeds a threshold value.

In a special embodiment the method 100 monitors the quality of a connection of a cable between components of the on-board electrical system of at least one vehicle during operation of that vehicle. In the reading-in step S1, a resistance value of the cable is determined in a sub-step at repeated time intervals, and in the classifying step S2, the error information is determined using the resistance value and predetermined comparative information. Between the determination procedures a drive motor of the vehicle was switched off at least once. This way, the reading in S1 and classifying S2 occur repeatedly and over a plurality of driving cycles, over a period of days, weeks or years. In step S3 all classified data is evaluated.

In other words in one embodiment the resistance value is determined at least once per driving cycle. The preferred resistance value is determined using the formation of a mean value per driving cycle.

Figure 2:
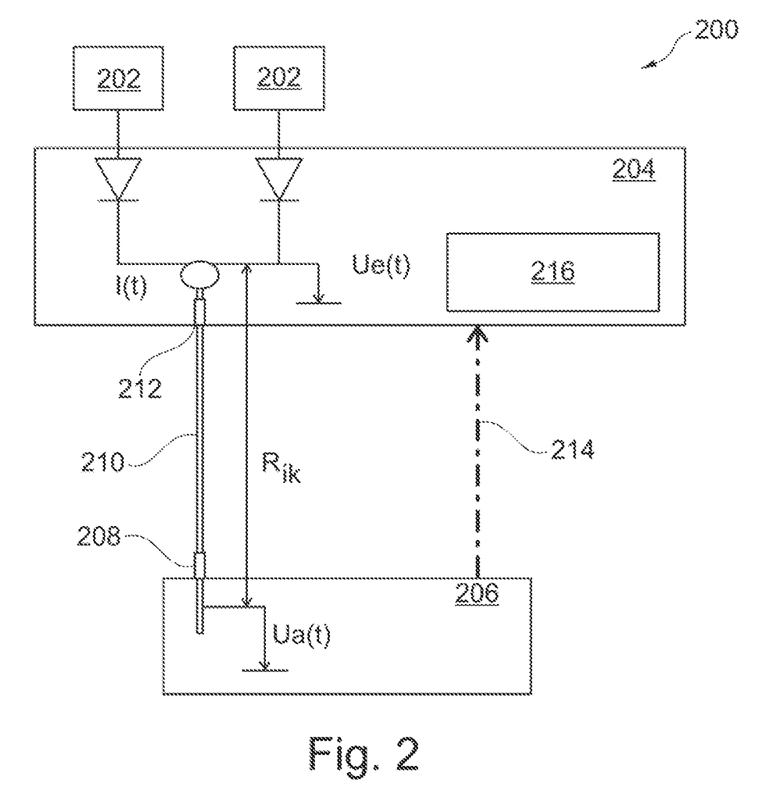
FIG. 2: a schematic view of a portion of an on-board electrical system of a vehicle.

FIG. 2 shows a schematic view of part of an on-board electrical system 200 of a vehicle. The on-board electrical system 200 comprises two power sources 202, a power distributor 204 and a load 206. The load 206 is a function that is relevant for the functional safety. An input 208 of the load 206 is connected through a cable 210 to an output 212 of the power distributor 204. The load 206 is further connected through a communications connection 214 to the power distributor 204 or to a control device 216 designed as a microcontroller µC.

In other words, FIG. 2 shows a functional-safety-relevant function 206 that is supplied through a cable 210 from a redundant source arrangement 202 (such as two batteries 202). The characteristic quantity indicating that the supply channel has been damaged is the total resistance $R_{iK}$ from the electronic distributor 204 to the circuit board with the load 206 (functional-safety function).

In a special embodiment the online diagnosis uses the following measuring variables, measured every 30 ms, for instance:
1. voltage measurement Ue(t) in the electronic power distributor 204
2. current measurement I(t) in the electronic power distributor 206, e.g., as a component of the electronic safeguarding.
3. voltage measurement Ua(t) in the load 206

The present transition resistance is calculated as $$R_{IK}(t) = [Ue(t) - Ua(t)]/I(t).$$

$R_{IK}$ can be calculated in the electronic current distributor 204. To this end, the voltage values Ua(t) in the functional-safety-relevant load 206 have to be communicated to the distributor 204 through a serial bus 214.

If the measurement in the load 206 is asynchronous to the one in the distributor 204, then Ue(t1) and Ua(t2) are measured at t1 and t2. Thus, especially for dynamic loads 206, a serious error can set in if, for example, a peak appears at t1 due to an inductive voltage that is no longer applied at t2.

In a special embodiment, the asynchronous measuring signals Ue(t) and Ua(t) are linked via a stochastic link.

An example of one approach is:

$$R_{IK} = \{MW[Ue(t)]_{\tau=3s} - MW[Ua(t)]_{\tau=3s}\}/MW[I(t)]_{\tau=3s}$$

A mean value (MW) is formed within a time window (here 3s) for the individual asynchronous measured quantities. The transition resistance is determined on the basis of the mean values. Having to transmit only the averaged voltage $MW[Ua(t)]_{\tau=3s}$ can also significantly reduce the load on the bus.

Thus, a self-diagnosis of the on-board electrical system is advantageously realized for a convincing functional-safety function.

Figure 3:
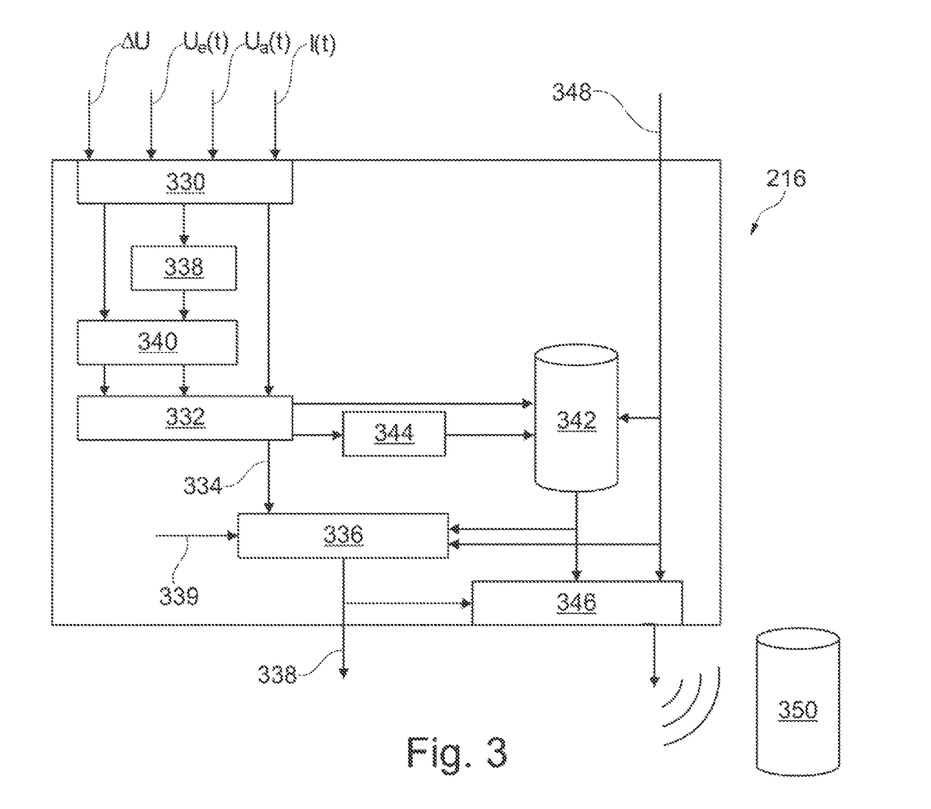
FIG. 3: a schematic view of a control device for monitoring (the connection quality between components of) an on-board electrical system of at least one vehicle in operation.

FIG. 3 shows a schematic view of a control device 216 for monitoring the quality of a connection between components of an on-board electrical system of at least one vehicle in operation. The on-board electrical system may be a variant of an on-board electrical system 200, parts of which are shown in FIG. 2.

The control device 216 has an interface 330 for reading in signals. Depending on the particular embodiment, the signals are analog signals that are then digitized, or they are already digital signals, such as those transmitted via a bus. Furthermore, the control device 216 has a unit 332 for determining the resistance value 334 of the cable to be monitored in the on-board electrical system, and a unit 336 for detecting error information 338. The resistance value 334 corresponds to the resistance $R_{ik}$ in FIG. 2. The error information in this case is determined using the resistance value 334. The resistance value here is understood to be a signal or information corresponding to the resistance $R_{ik}$ of the monitored cable. The unit 336 for detecting the error information 338 is configured to use the resistance value 334 and predetermined comparative information 339 to detect the error information 338.

In a preferred embodiment the control device 216 continues to read in, via the interface 330, a voltage drop across the cable that represents a voltage value ΔU, or an input current Ue(t) into the cable and an output current Ua(t) from the cable, in order to determine the resistance value 334. Referring back to FIG. 2 and the corresponding description, the input current Ue(t) into the cable corresponds to an output current from the power distributor 204 and the output current Ua(t) from the cable corresponds to an input current of the load 206. When the input current Ue(t) and the output current Ua(t) are read in, the voltage drop ΔU is optionally determined in a unit 338.

A current value I(t) is read in through the interface 330 and the resistance value 334 is determined as already described further above using the current value I(t).

In one embodiment the control device 216 includes a unit 340 for forming mean values of the read-in voltage values. The mean values here are either formed through a predefined mean-value time interval of several seconds or minutes or through a driving cycle in a preferred variant. In a further variant model calculations show that the determination of the transition resistance works very well with $$R_{IK}=\{MW[Ue(t)]_\tau - MW[Ua(t)]_\tau\}/MW[I(t)]_\tau$$

where τ="time span driving cycle". Thus, in one embodiment the mean values are formed over a complete driving cycle and the resistance value 334 is determined with these mean values.

Therefore, the microcontroller μC, or the control device in the load 206, averages the voltage Ua(t) over a driving cycle, and the intelligent distributor 204 the voltage Ue(t) and current I(t). After completion of the driving cycle these three data or rather the mean value of the three data over the driving cycle is transmitted to the infrastructure unit, also referred to as a cloud.

If a measurement of the current at the input side of the cable is not possible, there is the possibility of assuming a stochastic change in the transition resistance of the cable by correlating the voltage at the input Ue(t) and at the output Ua(t).

The voltage at the input Ue(t) is once more averaged over a driving cycle. The English notation $U_{in}$ is also used below instead of Ue(t) and $U_{out}$ for Ua(t), and the same applies to $MW1(U_{in})$ and $(MW1(U_{out}))$. These values are transferred to the cloud.

A correlation coefficient can then be calculated in which an additional averaging MW2 is calculated over the values of 20 driving cycles, for example, and hence the dispersion:

$$\partial_{MW_2(U_{in})} = MW_1(U_{in}) - MW_2(MW_1(U_{in}))$$

$$\partial_{MW_2(U_{out})} = MW_1(U_{out}) - MW_2(MW_1(U_{out}))$$

$$r_{U_{in}U_{out}} = \frac{MW_2(\partial_{MW_2(U_{in})} * \partial_{MW_2(U_{out})})}{\sqrt{MW_2(\partial_{MW_2(U_{in})}^2) * MW_2(\partial_{MW_2(U_{out})}^2)}}$$

The correlation coefficient then is usually 1, since the profile of the two voltages is identical. If a stochastic change of $U_{out}$ occurs due to a fluctuating transition resistance of the cable, then the correlation coefficient is reduced to 0.98, for instance.

In the embodiment depicted here the unit 340 for forming mean values is configured to determine the correlation coefficient and the dispersion in addition to forming the mean values.

In a particularly preferred embodiment the control device 216 also comprises a memory unit 342 designed to store the read-in and determined values and to make them available upon request. The averaged voltage values $MW1(U_{in})$, $MW1(U_{out})$ and, if present, the averaged current value MW1(I) are stored. If the memory capacity permits, additional resistance values, the dispersion and the correlation coefficient are also saved. The stored values are made available to the unit 336 for determining the error information.

To reduce data in the memory unit 342 in one variant, the values are only stored if they represent a new minimum and/or maximum. This is then checked in the maxima-determining unit 344.

The control device 216 is designed to ensure the functional safety of individual cables without redundancy, since potential errors can already be recognized early. To be able to make a reliable and possibly earlier diagnosis of degradation processes with even more data, in a particularly preferred embodiment the values determined by the control device or stored are transferred together with vehicle information 348 to an infrastructure unit 350 via an output interface 346. This will be described further with reference to FIG. 8.

The cloud approach, however, can already be realized within a vehicle if the data is compiled in a central memory of the vehicle and then evaluated. Thus, the central evaluating unit is put in a position to monitor and compare a plurality of cables or contacts between the cables and the distributors and loads. With knowledge of correlations between individual loads in the vehicle it is also possible to recognize trends leading to errors at a very early point in time and to issue a corresponding alert to a driver or a repair shop.

Figure 4:
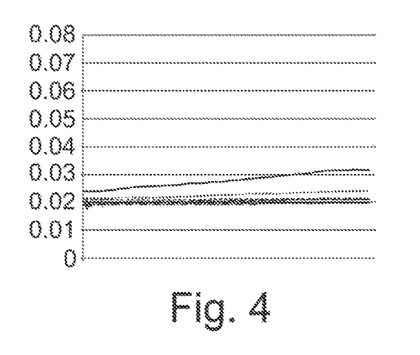
FIG. 4: a diagram showing changes in resistance of several connections over time.

FIG. 4 shows a diagram of resistance changes of several connections over time. It shows the rise in transition resistance of a cable due to a degradation process of one of the two contacts.

Figure 5:
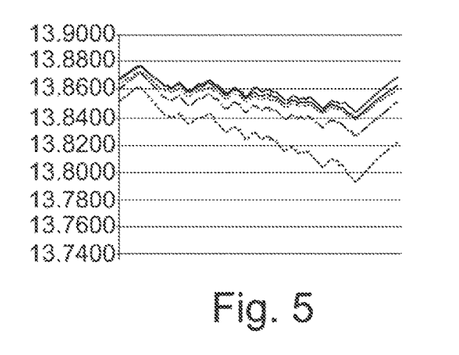
FIG. 5: a diagram showing voltages at a consumer over time.

FIG. 5 shows a diagram of voltages at a consumer over time. It shows the lowering of the consumer voltage on the basis of a cyclically recurring dynamic load at a supply voltage assumed to be constant.

Figure 6:
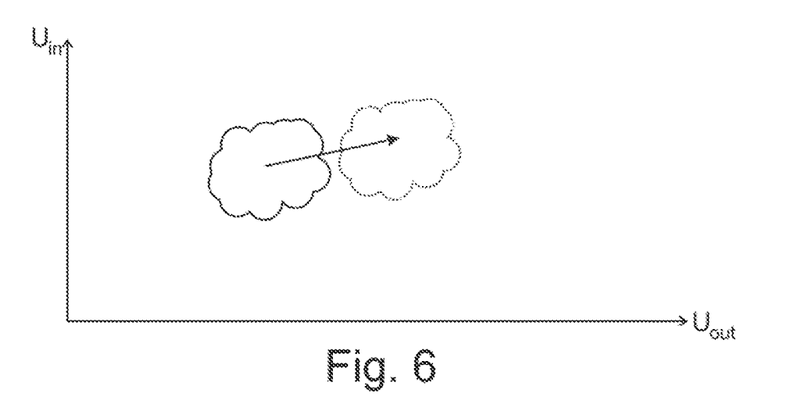
FIG. 6: a symbolic representation of the voltage drop over time.

FIG. 6 shows a symbolic representation of the voltage drop over time. In a specific practical application or concrete vehicle configuration the loads are within a fixed range with known, constant lower and upper limits. It follows from this that the voltage drop is within a predefined voltage range that correlates with the load range. If no error occurs the input voltage into the cable should also be viewed as being constant within a tolerance range. This having been established, the averaged voltage drop may be expected to lie within an indistinctly defined cloud. If this range, referred to here as an indistinct cloud, of an expected value for the voltage drop migrates, then an error may be assumed.

Figure 7:
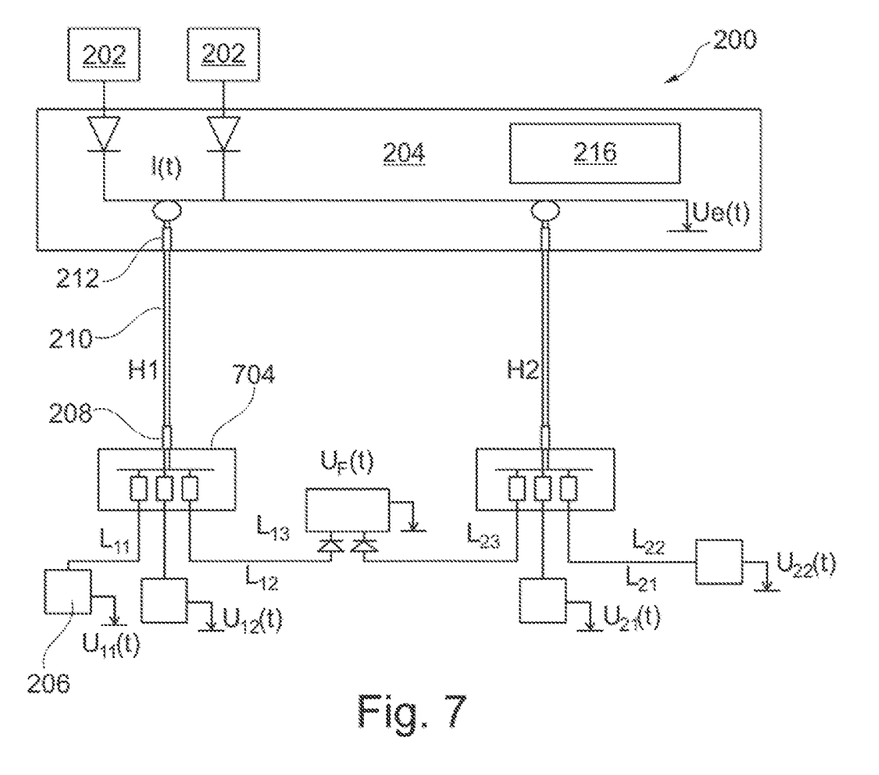
FIG. 7: a schematic view of an on-board electrical system of a vehicle.

FIG. 7 shows a schematic view of an on-board electrical system 200 of a vehicle. For the sake of clarity, similar components are not provided throughout with reference numbers.

Additional sub-distributors 704 and more loads 206 are shown here than in the on-board electrical system 200 depicted in FIG. 2.

In one embodiment almost every control device 216 measures its supply voltage in the on-board electrical system 200. One approach of the inventive idea is that a stochastic evaluation of all voltage measuring signals in the system makes it possible to recognize imminent errors in the overall system. A strategy is used for this which keeps the additional load on the bus systems as low as possible.

A simultaneous, sustained lowering of the voltage signals U11 and U12 relative to the other voltage signals indicates the existence of a degradation process of the cable H1 or of the sub-distributor 704. A sustained lowering of the voltage U21 alone indicates that there is a problem with the cable L21 or the load 206.

Each control device determines the probability distribution and dispersion of the voltage measuring values. Thus, raw data does not have to be transmitted. After a predetermined time interval the data on dispersion and probability distribution is transferred to a master, that recognizes shifts in the stochastic variables. The predetermined time interval can last up to 120 minutes; for example, the value may be greater than 3 and less than 60 minutes. Thus, in one embodiment the data on dispersion and probability distribution per driving cycle is gathered and transmitted every 10 minutes. In an alternative embodiment, one data value each on dispersion and probability distribution is determined and transmitted for a complete driving cycle. For instance, the time interval may last up to 8 or 24 hours.

Figure 8:
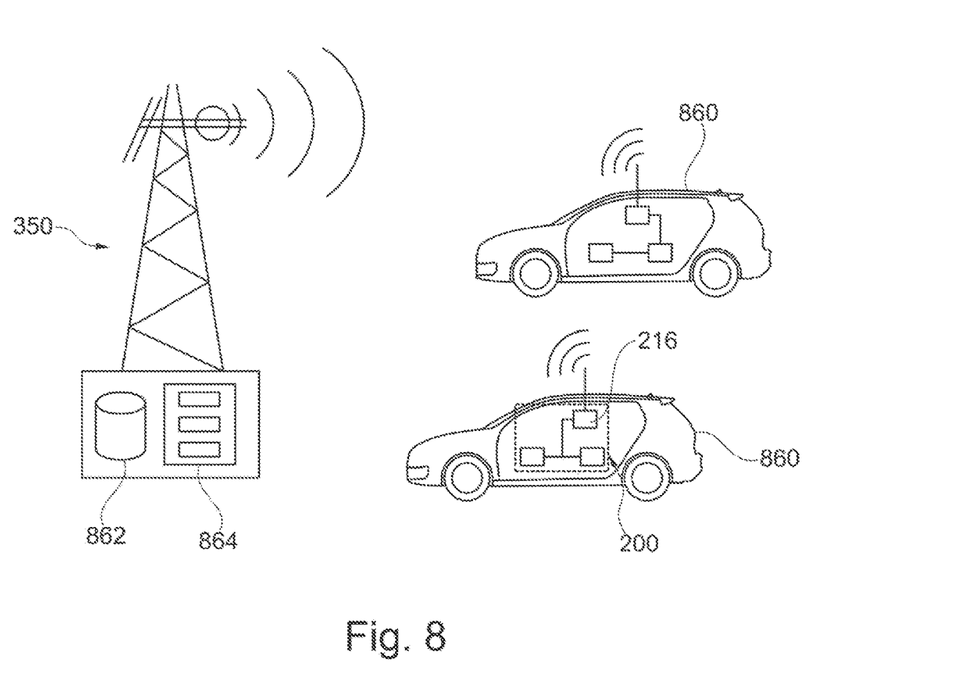
FIG. 8: a plurality of vehicles with a control device for monitoring the quality of the connection between components of the on-board electrical system, and an infrastructure unit.

FIG. 8 shows a plurality of vehicles 860, each having at least one control device 216 for monitoring the on-board electrical system 200, and an infrastructure unit 350. As already discussed in connection with FIG. 3, the control device 216 is embodied to transfer data present in the control device 216 to an infrastructure unit 350.

In a preferred embodiment the data is transferred from a plurality of control devices 216 of the on-board electrical system 200 to a higher-level control device in the vehicle. This device takes over the tasks of processing and storing and particularly transmitting to the infrastructure unit 350.

The infrastructure unit 350 comprises a central memory unit 862 and a device 864 with an interface for receiving the plurality of values from the plurality of vehicles 860; a memory unit for depositing the plurality of values in the central memory unit 862; a unit for determining at least one error information item for at least one on-board electrical system 200 of one of the vehicles 860, using the plurality of values; and an interface for making the error information available to at least one of the vehicles 860 or to a monitoring function such as a control center.

In the example shown, the error information can include the affected vehicles 860, the affected connection in the system and/or the loads connected to it, as well as an error probability or a trend for the error.

The method or control device described above is described with an easily understood, concrete example of monitoring the quality of a connection between a current source and a current sink, and of monitoring the determining of a resistance of the connecting cable. However, this can be more generally used in a vehicle; also, individual sensors, loads or other components in the on-board electrical system or components connected to the on-board electrical system can be monitored. The inventive arrangement also relates to a learning system that is capable of incorporating the permitted operational states (permitted state space) in a learning procedure. The learning procedure can be performed on the basis of an on-board system simulation. This can likewise be done during test drives such as a summer test and winter test. The result of the learning procedure is a state space with the dimension n corresponding to the quantity of linked parameters Pn. If individual parameters Pn lie outside of the permitted state space during use of the vehicle, an error or at least degradation is recognized. This is then made available as error information.

Error injection is used to check whether the state space is suitable for reliably recognizing errors. Thus, no 'false-positive' or 'false-negative' recognitions may occur. If this is the case, then the parameter space must be enlarged by one parameter and hence by one dimension where applicable, for example by the parameter of environmental temperature or driving dynamics.

In this way a standardized procedure is created for the diagnosis of all functions of the vehicle. The number of parameters Pn can be adjusted where necessary. From the original state space P1, P2, . . . Pn functional mapping into new state spaces can take place, one example being dP1/dt, dP2/dt, . . . dPn/dt.

The functional mappings can also take place in state spaces with reduced dimensionality of to the dimension 1: P1 or dimension 0 with the statement good/bad. The procedure allows a reduction of the data quantity for a remote online diagnosis for fleets of connected vehicles.

Figure 9:
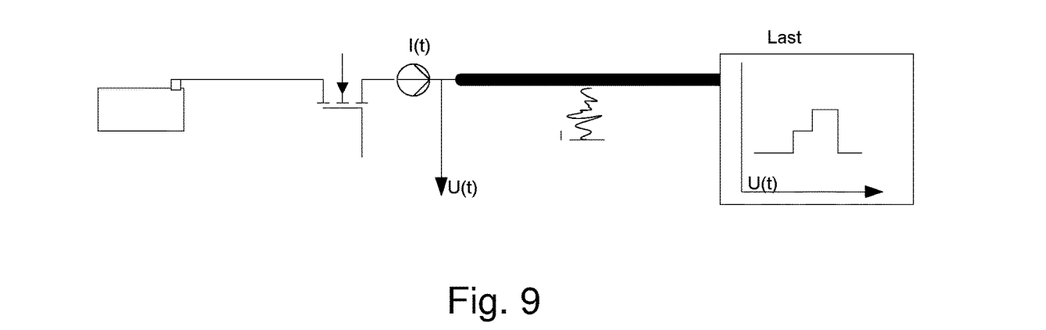
FIG. 9: a schematic view of an on-board electrical system of a vehicle.

An additional application is shown in FIG. 9. An arrangement is shown here having a source, an electronic distributor with current and voltage measurement and a consumer. In the arrangement according to FIG. 9 a parallel arc is assumed to be the source of the error. An example of the load 206 selected here is a climatic compressor in the 48-V on-board electrical system, which can be operated in three power stages 1 kW, 2 kW and 3 kW.

The consumer 206 is presumed to be output-controlled. If the on-board electrical system voltage U(t) fluctuates, its input current I(t) also fluctuates as P=U*I.

Figure 10:
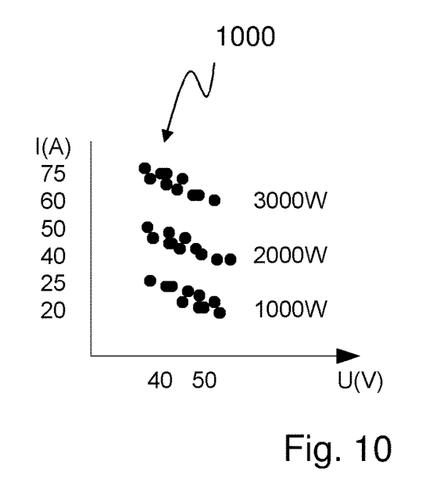
FIG. 10-FIG. 17: a graphical illustration in Cartesian coordinate systems of state spaces.
Figure 11:
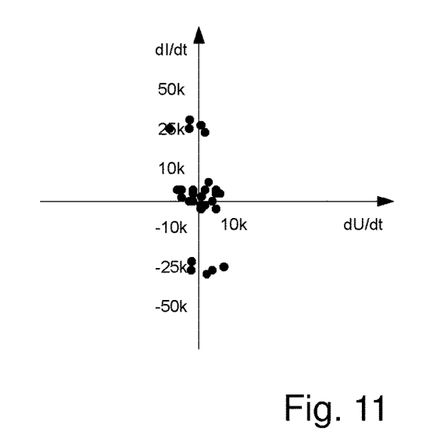

The subsequent figures show read-in data of current I(t) overvoltage U(t) or the values derived from them. In a tread-in procedure, current and voltage are measured in the electronic current distributor, for instance every 10 ms, then it is recorded in a state space 1000. Thus, FIG. 10 shows the two-dimensional state space 1000 I over U. The three power stages of the compressor are plotted here. Analogous to this, FIG. 11 shows a state space 1000 derived via the functions dU/dt and dI/dt. It refers to the changes in time of the parameters, including the switching of the power stages.

Figure 12:
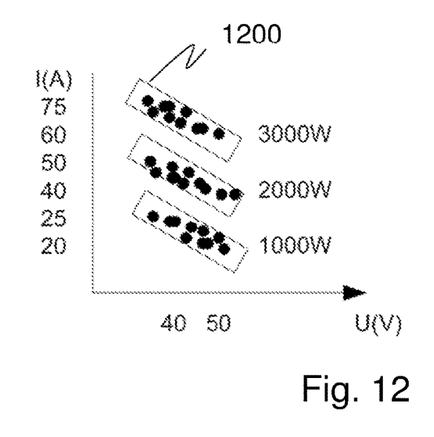
Figure 13:
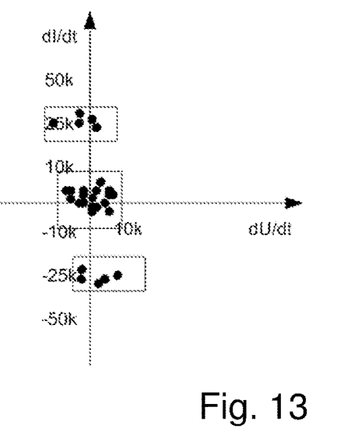

FIGS. 12 and 13 show that envelopes of the "good" state spaces 1000 can be defined. These "good" envelopes, designated here as discriminating limit(s) 1200, in the state spaces 1000 therefore allow the load to be classified.

If the measured values of the online measurement in the vehicle move to the outside of the "good" envelope, this indicates the presence of an error.

Figure 14:
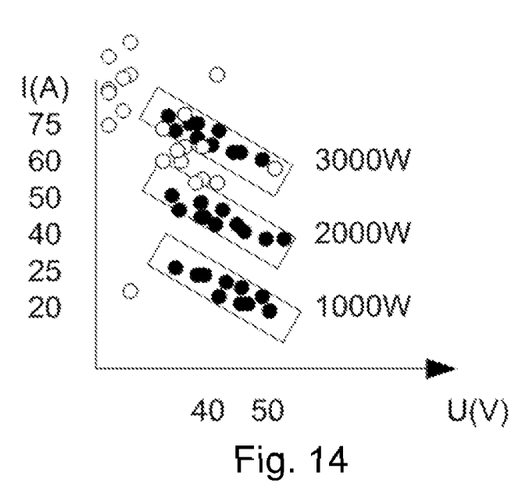
Figure 15:
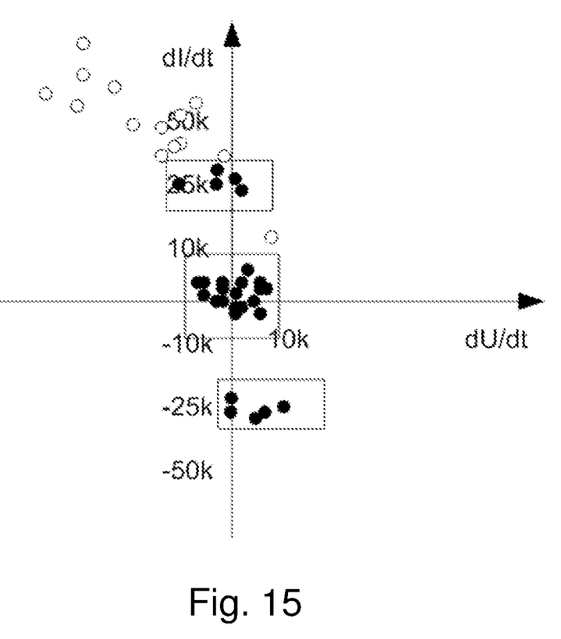

FIGS. 14 and 15 show how the measured values fall outside of the "good" envelope when a parallel arc appears. Criteria for the error recognition can now be defined; for example, errors occurring when at least five values appear outside of the "good" envelope in 50 ms with spacing of less than 20 k and with two values outside per 10 ms when the spacing from "good" envelopes >20 k.

It is possible that the state space shown above is only valid at one temperature, for instance 25° C. If this is the case, then the state space is expanded by the dimension of "temperature."

A prerequisite for successfully conducting the method introduced here is that a classification of the load according to FIG. 12/FIG. 13 be possible.

The procedure permits a reduction of the data quantity for a remote online diagnosis for fleets of connected vehicles. For this purpose, the data is only communicated "upwardly" when it shifts its focal point in the state space or migrates toward the boundary of the "good" envelope (early-warning subspace).

Figure 16:
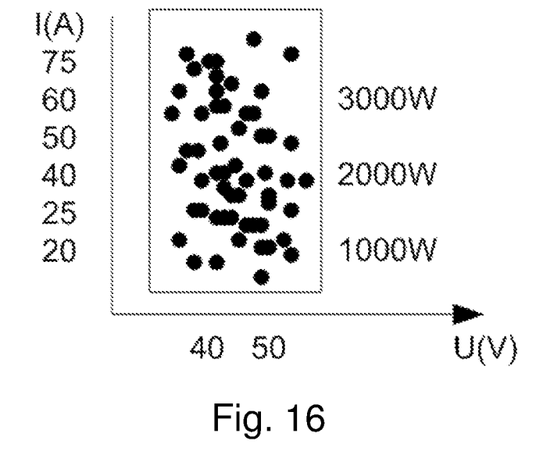
Figure 17:
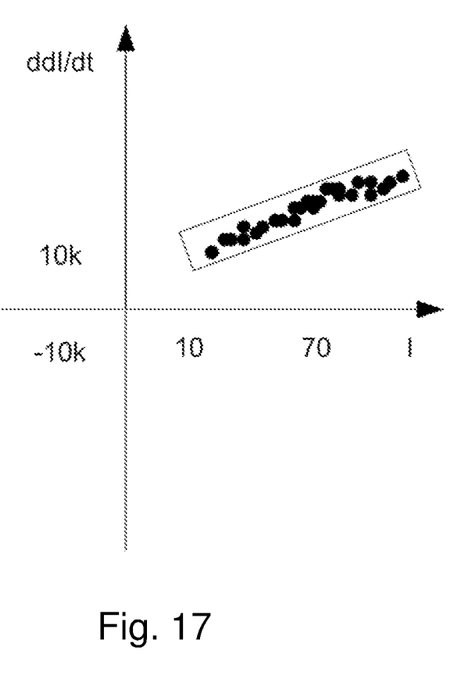

FIG. 16 shows the original state space 1000 of a continuously controlled compressor. Since a large space is defined, the segregation of "bad" states is not easily possible. If, on the other hand, the rate of change of the differential current value is used—see FIG. 17—then this example maps the control characteristics of the controlled load. In the event of an error (arc) state points appear outside of the controller behavior of the load. Thus, this classification would permit recognition of the error.

Figure 18:
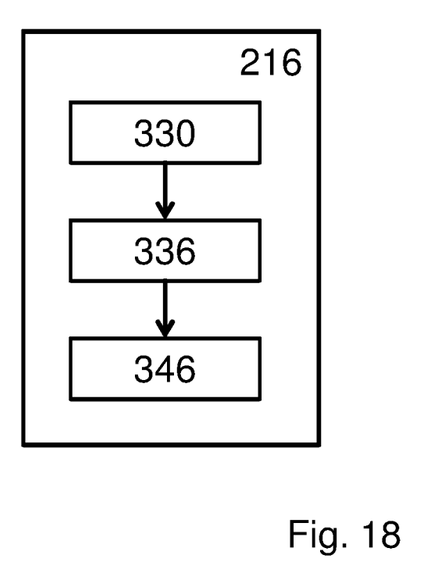
FIG. 18: a schematic view of a control device for monitoring and on-board electrical system of at least one vehicle in operation.

FIG. 18 shows another embodiment of a control device 216 for monitoring an on-board electrical system of a vehicle. The control device 216 comprises at least one unit 330 for reading in a sequence of data for a number of parameters that represent information about operation of the vehicle by a driver and/or a state of the vehicle and/or a state of the driver and/or a driving environment; a unit 336 for classifying the data as a normal value or an error value, wherein the normal values per parameter lie within a state space separated from the error values by a discriminating limit; and a unit 346 for evaluating the data classified as an error value, wherein an error is recognized if the data classified as an error value fulfils a criterion; and/or for evaluating the data classified as a normal value, wherein the data classified as a normal value is statistically evaluated to determine a statistical parameter and an error is recognized if the statistical parameter exceeds a threshold value.

LIST OF REFERENCE NUMBERS 100 method
S1 reading-in step
S2 classifying step
S3 evaluating step
200 on-board electrical system
202 energy source
204 distributor
206 load
208 load input
210 cable
212 distributor output
214 communication connection, bus
216 control device
$U_e(t)$ input voltage
$U_a(t)$ output voltage
$I(t)$ current
$R_{ik}$ resistance (of the cable)
330 interface, reading unit
332 determination unit
334 resistance value
336 detecting unit, classifying unit
338 error information
339 comparative information
$\Delta U$ voltage value, voltage drop
340 device for forming mean values
342 memory
344 maxima-defining unit
346 output interface
348 vehicle information
350 infrastructure unit
$U_{11}$, $U_{12}$ voltage signals
$H_1$ cable
704 sub-distributor
U21 voltage
$L_{21}$ cable
860 vehicle
862 central memory unit
864 device
Pn Parameter
1000 state space
1200 discriminating limit

What is claimed is:

1. A method for monitoring an on-board electrical system of a vehicle, with the on-board electrical system having at least one distributor, a load interconnected via a cable, and one or more sensors configured to measure at least one of a voltage value or a current value at a location in the on-board electrical system, the method comprising:

reading in, from the one or more sensors and during a least a first time interval and a second time interval, a sequence of data for a number of parameters based upon which a resistance value of the cable is determined, wherein the vehicle is operated during the first and second time intervals and a drive motor of the vehicle is switched off between the first and second time intervals;

classifying, using at least one processor, each data within the sequence as a normal value or an error value, wherein the normal values per parameter lie within a state space separated from the error values by a discrimination limit;

evaluating, using the at least one processor, the data classified as an error value or as a normal value, wherein evaluating the data classified as an error value comprises determining whether the data fulfills a criterion, and evaluating the data classified as a normal value comprises statistically evaluating the data to determine a stochastic parameter and detecting error information when the stochastic parameter exceeds a threshold value; and outputting a message indicative of a malfunction when: (i) the data is classified as an error value and fulfills the criterion, or (ii) the data is classified as a normal value and the stochastic parameter exceeds the threshold.

2. The method according to claim 1, wherein evaluating the data further comprises monitoring the quality of a connection between components of the on-board electrical system.

3. The method according to claim 1, wherein reading in a sequence of data further comprises reading in a voltage value representing a voltage drop through the cable as a first parameter and determining the resistance value using the voltage value.

4. The method according to claim 3, further comprising:
determining a mean value from the voltage values read in during a predefined mean-value time interval, and
using the mean as the voltage value.

5. The method according to claim 4, further comprising:
determining a dispersion using the mean-value and a plurality of mean values determined in preceding mean-value time intervals,
wherein detecting error information comprises detecting using the dispersion.

6. The method according to claim 3, wherein reading in a sequence of data further comprises reading in an output voltage value representing an output voltage at an output of the distributor and an input voltage value representing an input voltage at an input of a sub-distributor connected to the output or representing the load, and determining the voltage drop through the cable using the output voltage and input voltage.

7. The method according to claim 1, wherein reading in a sequence of data further comprises reading in a current value representing a current between an output of the distributor and an input of the load, and determining the resistance value using the current value.

8. The method according to claim 1, further comprising:
storing data for a number of parameters, wherein the data includes at least one of resistance values, voltage values, current values, output voltage values, input voltage values, mean values, or at least one stochastic parameter.

9. The method according to claim 8, wherein storing data further comprises storing the values when they represent at least one of a new minimum or maximum.

10. The method according to claim 8, wherein storing data further comprises storing the values when they have a minimum distance from a previously stored value.

11. The method according to claim 8, wherein storing data further comprises storing at least one other item of vehicle information and detecting error information comprises detecting using the at least one other item of vehicle information.

12. The method according to claim 8, further comprising transmitting the values stored to a central infrastructure unit.

13. The method according to claim 1, wherein one or more of reading in, classifying, determining, evaluating or detecting are repeated and detecting the error information comprises detecting using one or more stored values.

14. The method according to claim 1, further comprising:
receiving a plurality of values from a plurality of vehicles in an infrastructure unit;
depositing the plurality of values in a central memory unit of the infrastructure unit;
determining at least one item of error information for one or more on-board electrical systems of one of the vehicles using the plurality of values of the plurality of vehicles; and
making the error information from the infrastructure unit available to at least one of one or more of the vehicles or a monitoring function for the plurality of vehicles.

15. The method according to claim 1, wherein evaluating the data classified as a normal value further comprises determining a focal point of the data as a statistical parameter and detecting error information comprises determining if a movement of the focal point over time is greater than a threshold value.

16. The method according to claim 1, wherein evaluating data classified as an error further comprises determining if a value exceeds a limit value of the criterion at a predetermined time interval.

17. The method according to claim 1, further comprising training a state space, wherein a sequence of learning data is read in for a number of parameters, the parameters having been categorized beforehand as normal values, and defining at least one envelope as a discrimination limit for the trained state space.

18. The method according to claim 1, further comprising deriving one or more sequences of data after reading in and before classifying, wherein classifying the data further comprises classifying the one or more derived sequences of data, and evaluating the data further comprises evaluating the one or more derived sequences of data.

19. A control device for monitoring an on-board electrical system of a vehicle, wherein the on-board electrical system has at least one distributor, a load connected together via a cable, and one or more sensors configured to read at least one of a voltage value or a current value at a location in the on-board electrical system, the control device comprising:
a processor configured to:
read in, during a least a first time interval and a second time interval, a sequence of data for a number of parameters based upon which a resistance value of the cable is determined from the one or more sensors of the-board electrical system, wherein the vehicle is operated during the first time interval and the second time interval and a drive motor of the vehicle is switched off between the first time interval and the second time interval;
classify the data as a normal value or an error value, wherein the normal values per parameter lie within a state space separated from the error values by a discrimination limit;
evaluate the data classified as an error value or as a normal value, wherein evaluating the data classified as an error value comprises determining if the data fulfills a criterion, and evaluating the data classified as normal value comprises statistically evaluating the data to determine a statistic parameter and detecting an error if the statistical parameter exceeds a threshold value; and
output a message indicative of a malfunction when the data is classified as an error value and the data fulfills the criterion or when the data is classified as a normal value and the stochastic parameter exceeds the threshold.

* * * * *